United States Patent [19]

André et al.

[11] Patent Number: 5,282,275
[45] Date of Patent: Jan. 25, 1994

[54] ADDRESS PROCESSOR FOR A SIGNAL PROCESSOR

[75] Inventors: Tore M. André, Bandhagen; Karl-Gunnar A. Röjås, Solna, both of Sweden

[73] Assignee: Telefonaktiebolaget L M Ericsson, Stockholm, Sweden

[21] Appl. No.: 639,545

[22] Filed: Jan. 10, 1991

[30] Foreign Application Priority Data

Jan. 16, 1990 [SE] Sweden .................... 9000155

[51] Int. Cl.⁵ .................................... G06F 12/00
[52] U.S. Cl. .................... 395/400; 364/DIG. 1; 364/255.1; 364/251
[58] Field of Search ........... 364/724.01; 395/400, 395/425

[56] References Cited

U.S. PATENT DOCUMENTS

| | | | |
|---|---|---|---|
| 4,722,067 | 1/1988 | Williams | 364/746 |
| 4,800,524 | 1/1989 | Roesgen | 395/400 |
| 4,908,748 | 3/1990 | Pathak et al. | 395/400 |

FOREIGN PATENT DOCUMENTS

0042452 12/1981 European Pat. Off. .

OTHER PUBLICATIONS

*Derwent's Abstract* No. 86-297756/45, SU-1223346. Apr. 7, 1986.

*Primary Examiner*—Rebecca L. Rudolph
*Attorney, Agent, or Firm*—Burns, Doane, Swecker & Mathis

[57] ABSTRACT

The invention relates to an address processor for a signal processor. This address processor comprises means for address calculation in a read/write memory containing at least one circular buffer for storing state variables of digital filters. This means comprises a set of registers for storing the current folding address for each circular buffer relative to the absolute start address of the buffer. Furthermore, a calculation unit (+) is included for (1) adding the current folding address to the displacement (data_addr, write_addr) of a selected state variable relative to the corresponding buffer start address, (2) reducing the sum obtained in step (1) with the corresponding buffer length (mod_numb) if the sum exceeds or is equal to this buffer length, and (3) adding the buffer start address to the result obtained in (2) for obtaining the absolute address of the selected state variable.

9 Claims, 7 Drawing Sheets

Fig. 4(e)

| | |
|---|---|
| Y(n-1) | ← mod_start, filter_addr(0) |
| Y(n-2)/W(n) | |
| W(n-1) | ← filter_addr(1) |
| W(n-2) | |
| X(n) | ← filter_addr(2) |
| X(n-1) | |
| X(n-2) | |
| X(n-3)/Y(n) | ← mod_pointer |

Fig. 4(f)

| | |
|---|---|
| Y(n-2)/W(n) | ← mod_start, filter_addr(0) |
| W(n-1) | |
| W(n-2) | ← filter_addr(1) |
| X(n) | |
| X(n-1) | ← filter_addr(2) |
| X(n-2) | |
| X(n-3)/Y(n) | |
| Y(n-1) | ← mod_pointer |

Fig. 4(g)

| | |
|---|---|
| W(n-1) | ← mod_start, filter_addr(0) |
| W(n-2) | |
| X(n) | ← filter_addr(1) |
| X(n-1) | |
| X(n-2) | ← filter_addr(2) |
| X(n-3)/Y(n) | |
| Y(n-1) | |
| Y(n-2)/W(n) | ← mod_pointer |

Fig. 4(h)

| | |
|---|---|
| W(n-2) | ← mod_start, filter_addr(0) |
| X(n) | |
| X(n-1) | ← filter_addr(1) |
| X(n-2) | |
| X(n-3)/Y(n) | ← filter_addr(2) |
| Y(n-1) | |
| Y(n-2)/W(n) | |
| W(n-1) | ← mod_pointer |

ADDRESS PROCESSOR FOR A SIGNAL PROCESSOR

The present invention relates to an address processor for a signal processor for calculating addresses in a read/write memory containing state variables for digital filters.

BACKGROUND OF THE INVENTION

In connection with implementation of digital filters in signal processors and where input data samples to said filters are stored in a read/write memory some form of address processor is required for writing and reading the state variables of said filters. These filters can be both recursive (IIR) and non-recursive (FIR). A filter is calculated by reading the state variables from the memory and calculating output data. These output data then become input data or state variables to the next filter and are therefore written back to said memory. Generally a filter system can comprise several filters, which also can have different sampling frequencies.

After a calculation of a filter value all the state variables in a filter are shifted one position in the memory. The oldest state variable is written over by the next oldest, and a new sample is stored in the memory position that has been freed through the shifting operation.

A drawback of this previously known method is that the shifting in said memory is a time consuming operation, since all the state variables have to be read and written into new memory positions.

Another drawback is that this shifting operation also is power consuming. This is important for instance in connection with signal processors in battery driven telephones, where the available energy is limited.

DESCRIPTION OF THE PRIOR ART

A common method for addressing and shifting state variables for a digital filter implemented by a signal processor and a read/write memory is to use a circular buffer of size $2^n$, where n is an integer greater than 0. A pointer indicates the memory position of the oldest state variable, that is the folding address of the circular buffer. After reading the oldest state variable a new sample is written into the indicated memory position, said oldest state variable being written over. If the pointer now is changed to point to the next oldest state variable, said pointer will indicate a new folding address. The previously next oldest state variable is now the oldest, and the result of this procedure is equivalent to shifting all state variables in a circular buffer one memory position without physically moving them. Only the pointer has been updated to indicate the new folding address. The method is therefore called virtual shifting. When said pointer has reached the first memory position of the circular buffer it will, after the next shift, point to the last memory position. Thus, the addressing of the buffer can be denoted "addressing modulo $2^n$".

However, an important drawback of this previously known method is that the buffer only can be of size $2^n$, so that the filters have to be of size $2^n$. This makes the method suitable only for certain special filters.

Another previously known method uses a buffer of any length and makes use of a pointer that is shifted down from the end to the beginning of the buffer during the filter calculation. When the pointer has reached the beginning of the buffer, said pointer is once again loaded with the address of the end of the buffer, so that the procedure can be repeated.

A drawback of this previously known method is that it is not possible at an arbitrary time to address an arbitrary state variable in an arbitrary filter. The method will only work if the filters are calculated in sequence in accordance with the above. This makes the method unusable as a starting point for a general address processor.

OBJECT OF THE INVENTION

An object of the present invention is to provide an address processor of the type mentioned above, which processor is capable of addressing and virtually shifting state variables of at least one circular buffer for at least two digital filters stored one after the other in said buffer, said filters having an arbitrary number of delay elements or an arbitrary length, but the same sampling frequency.

SUMMARY OF THE INVENTION

In accordance with the invention the above object is achieved with an address processor with the feature of claim 1.

SHORT DESCRIPTION OF THE DRAWING

The invention will described in detail below with reference to the accompanying drawing, in which:

FIGS. 4a–4h illustrate the location of the filters and the folding address of the buffer in FIG. 2 during consecutive calculation steps;

DESCRIPTION OF PREFERRED EMBODIMENTS

Figure 1:
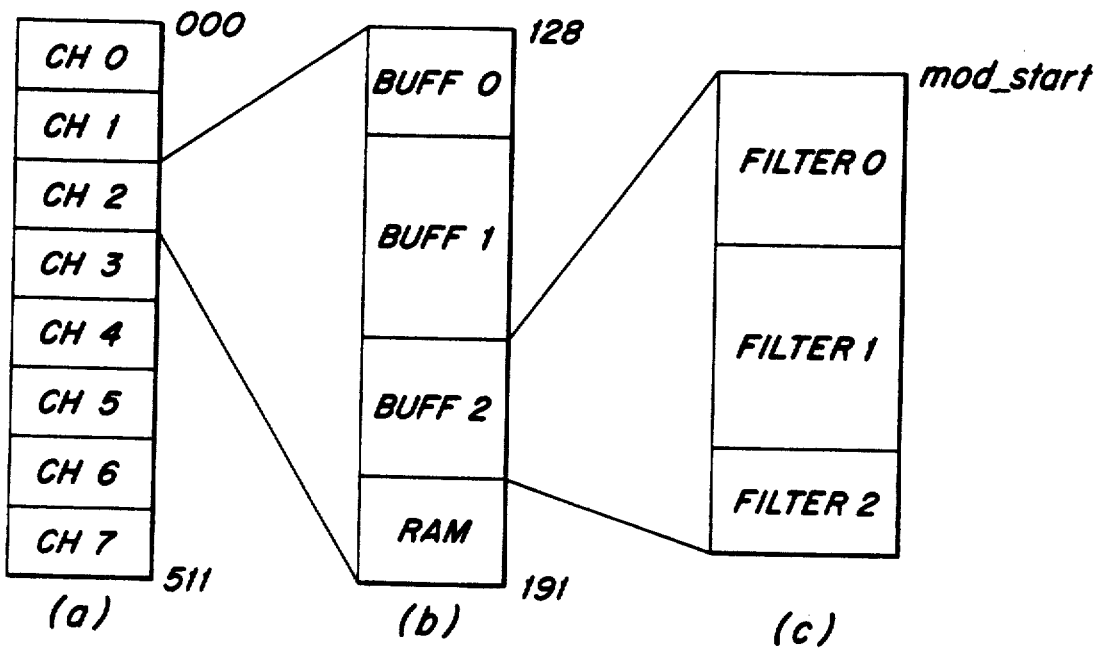
FIG. 1 shows the division of the data memory in connection with the present invention.

FIG. 1 shows the memory organisation for that part of the RAM that contains state variables for different filters. In this case it is assumed that the memory comprises filters for eight channels CH 0-CH 7. Each channel contains buffers BUFF 0 - BUFF 2. The number of buffers is arbitrary, but each channel has the same number of buffers with corresponding lengths. The buffers in turn contain filters FILTER 0 - FILTER 2. The buffers normally have different lengths, but the filters in each buffer correspond to the same sampling frequency. In the present invention at least one buffer contains two or more filters. The buffer lengths depend of the sum of the filter lengths; in fact the buffer length is formed by the sum of the number of delay elements of the included filters plus 1.

Figure 2:
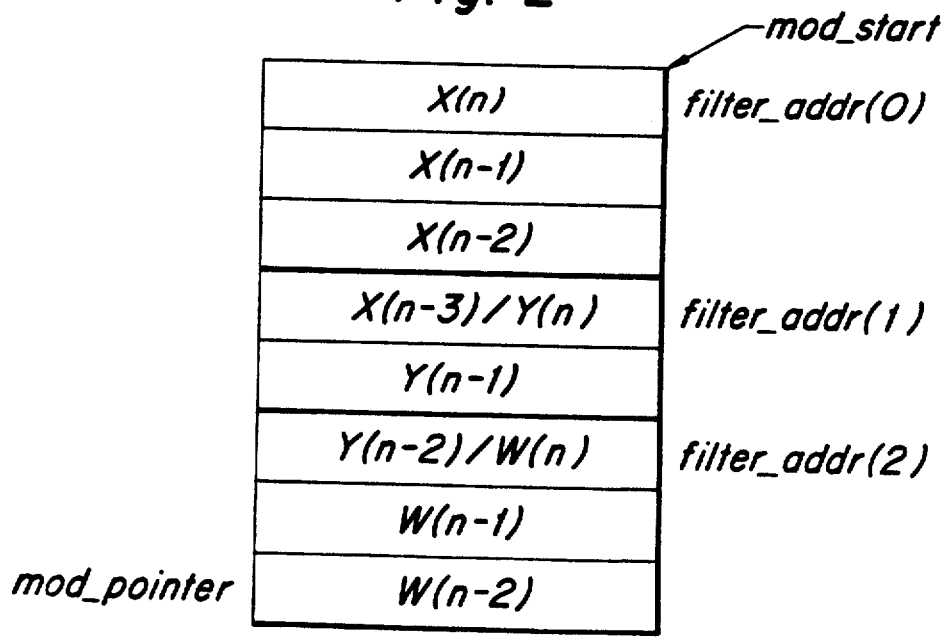
FIG. 2 shows the division of a buffer in connection with the present invention.

FIG. 1 shows a data memory divided into eight channels CH 0 - CH 7. The invention is not limited to eight channels, rather an arbitrary number of channels is possible. Furthermore, FIG. 1 indicates a data memory containing 512 memory cells. However, this number can also vary. FIG. 2 shows the contents of a buffer in detail. In the example a buffer comprises three filters with filter start addresses filter_addr(0), filter_addr(1), filter_addr(2). The absolute start address is denoted mod_start. The state variables in the first filter are denoted $X(n)$, $X(n-1)$, $X(n-2)$, $X(-3)$. Here $X(n)$ indicates the latest sample, $X(n-1)$ the next latest sample, etc.

In order to facilitate the following description it is initially assumed that the three filters in the buffer in FIG. 2 are non-recursive.

In this case the state variables are fetched one after the other from the memory during the calculation of FILTER 0, starting from the oldest state variable $X(n-3)$, and multiplied by the corresponding filter coefficients, which are fetched from RAM or ROM. The filter is calculated by summing these multiplied state variables. When the filter has been calculated the obtained value $Y(n)$ is written into the memory cell for the oldest state variable $X(n-3)$. In FIG. 2 this has been indicated by letting the state variable or sample $X(n-3)$ share the memory cell with the filter output signal $Y(n)$. The calculated filter values $Y(n)$, $Y(n-1)$ ... in this way form input signals to FILTER 1. FILTER 1 is calculated in a corresponding way, and after calculation its value is written into the memory cell for the oldest state variable $Y(n-2)$ as input signal to FILTER 2. This procedure, where the output signal from one filter forms the input signal to the next filter is possible due to the fact that the filters in the buffer correspond to the same sampling frequency.

Figure 3:
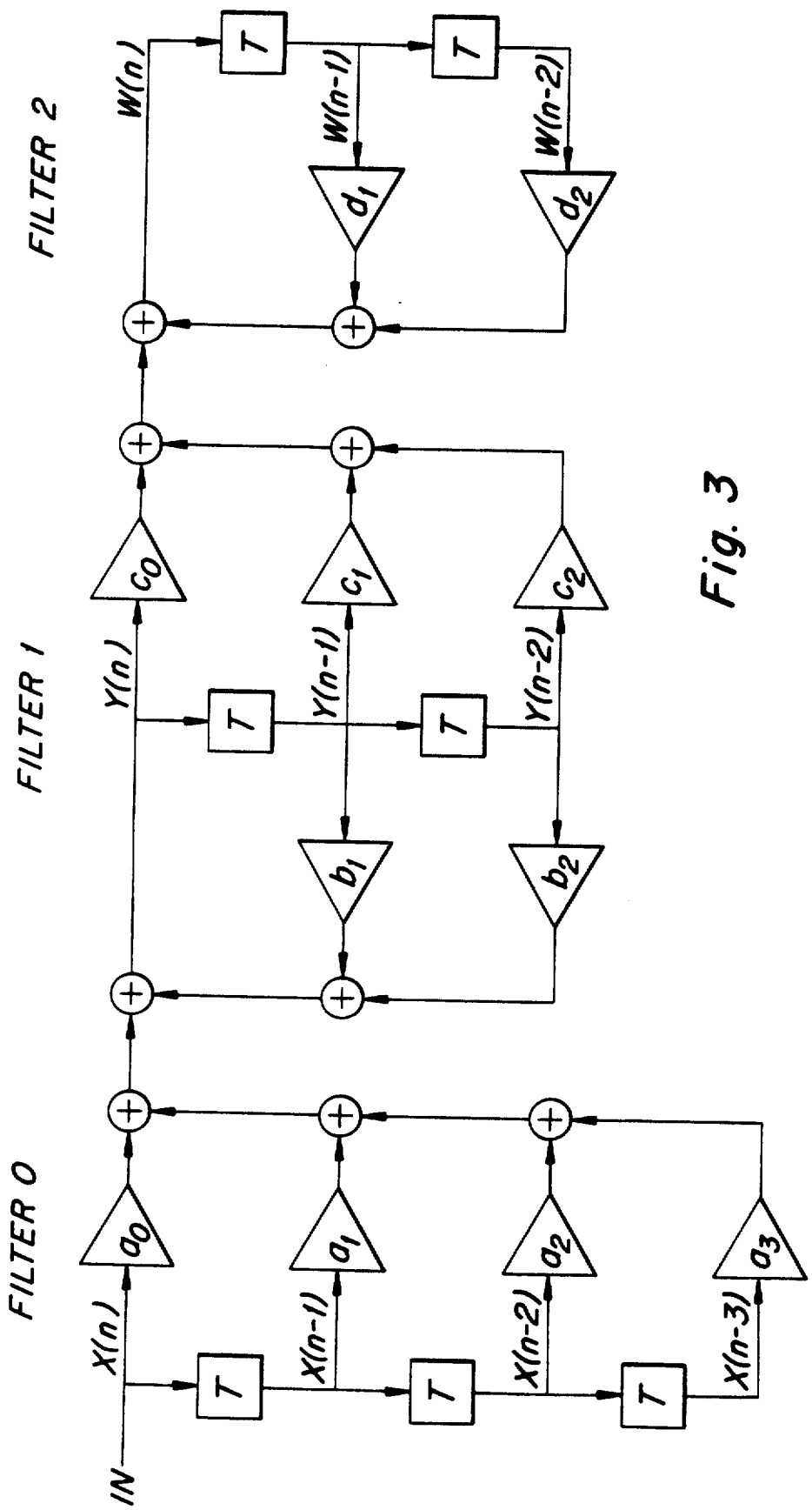
FIG. 3 shows a filter diagram for the filters in the buffer of FIG. 2.

FIGS. 3 and 4 further illustrate the calculation process, in particular also the complications that arise in connection with recursive filters.

FIG. 3 shows a more general filter diagram for the filters in the buffer of FIG. 2. As previously the first filter, FILTER 0, is a non-recursive filter that only contains a transversal part. However, the second filter, FILTER 1, contains a recursive left part and a transversal right part. The third filter, FILTER 2, contains only a recursive part and no transversal part.

In FIG. 3 the delay elements have been indicated by T. As can be seen from FIG. 2 FILTER 0 contains three delay elements T and four coefficients $a_0 ... a_3$. FILTER 1 contains two delay elements T and two coefficients $b_1$, $b_2$ in the recursive part and three coefficients $c_0 ... c_2$ in the transversal part. FILTER 2 contains two delay elements T and two coefficients $d_1$, $d_2$. According to the calculation rule above the buffer has a length of $3+2+2+1$, that is 8.

FIG. 4 shows a sequence of calculation for the three filters in FIG. 3.

It is essential to note two things in FIG. 4.

Firstly, the values of the state variables $X(n)...$, $Y(n)$ ..., $W(n)$ ... always lie still in the memory cell they have once been allocated. For each new figure (a)-(h) n is increased by 1, that is $X(n)$ will be denoted $X(n-1)$, etc. The values of the state variables, however, still remain in the original memory cell. The oldest state variables are then overwritten with new state variable values when they are no longer needed. Thus, it is not necessary to move the state variables.

Secondly, the folding address, mod_pointer, of the buffer is continuously updated. This pointer always points to the memory address where the circular buffer folds, in this case the border between FILTER 2 and FILTER 0. The pointer mod_pointer forms a "zero-reference", with which it is possible to obtain a correct absolute address for a current state variable, which will be illustrated in detail below.

For the calculation of the address to a certain state variable the following variables are utilized:

| | | |
|---|---|---|
| mod_start | = | the absolute start address of the buffer; |
| data_addr | = | the displacement of the chosen state variable relative to the buffer start address, mod_start; |
| write_addr | = | the chosen write address relative to the buffer start address, mod_start; |
| mod_numb | = | the buffer length, can be chosen arbitrarily; |
| mod_pointer | = | the current folding address of the buffer; |
| rel_addr | = | the calculated address relative to the buffer start address, mod_start; |
| dmaddr | = | the final, absolute memory address. |

During the calculation of the address to a state variable the sum data_addr + mod_pointer is first calculated. Thereafter it is tested whether this sum is less than mod_numb. If this is the case rel_addr is set equal to the obtained sum, that is rel_addr = data_addr + mod_pointer However, if the condition is not fulfilled, that is the sum is greater that or equal to mod_numb, rel_addr is set to rel_addr = data_addr + mod_pointer − mod_numb In both cases the displacement of the sought memory position relative to the buffer start address, mod_start, is obtained. The final, absolute data memory address, dmaddr, is obtained by adding mod_start to the obtained result, that is dmaddr = rel_addr + mod_start Initially mod_pointer is set to mod_pointer = mod_numb − 1 so that rel_addr = data_addr − 1

A write address is calculated in the same way, with the difference that data_addr is replaced by write_addr. The calculation of FILTER 0, FILTER 1 and FILTER 2 is performed in the following way.

1) The input signal is written into position $X(n)$.
2) FILTER 0 is calculated in the following way. First data_addr is set to filter_addr(0)+index, where index=3. With this value for data_addr the address to $X(n-3)$ is calculated in accordance with the above. $X(n-3)$ is fetched from the memory cell that is pointed to and multiplied by coefficient $a_3$. Thereafter index and therefore also data_addr is decremented by 1. $X(n-2)$ is fetched and multiplied by $a_2$. The product is added to the previously obtained product. In a corresponding way index is stepped down all the way to 0, so that all the variables in FILTER 0 are fetched in turn one after the other, multiplied by the corresponding coefficient and added. Thereafter FILTER 0 has been calculated.
3) FILTER 1 is calculated in the following way. First the recursive left part is calculated by setting data_addr to filter_addr(1)+index, where index=2. Hereby $Y(n-2)$ is pointed to and multiplied by $b_2$, whereafter index and therefore also data_addr is reduced by 1. The obtained product is added to the result obtained from FILTER 0. In the corresponding way $Y(n-1)$ multiplied by coefficient $b_1$ is also added to the previously obtained result. At the next decrementation of index the address of position $X(n-3)/Y(n)$ is obtained. The result $Y(n)$ obtained is now written over the previous state variable X(n−3) in this memory position. Now all necessary state variables Y(n), Y(n−1) and Y(n−2) for calculating the transversal write part of FILTER 1 are available. This calculation is done in the same way as the calculation of FILTER 0, the difference being that filter__addr(1) and index=2 are used for calculating data__addr in the first step.

4) FILTER 2 is calculated in the same way as the recursive part of FILTER 1, the difference being that filter__addr(2) is used for the calculation of data__addr and $d_1$, $d_2$ are used as coefficients. In the initial step index is set equal to 2. When index has reached the value 0 the result W(n) is written over the value Y(n−2).

Figure 4B:
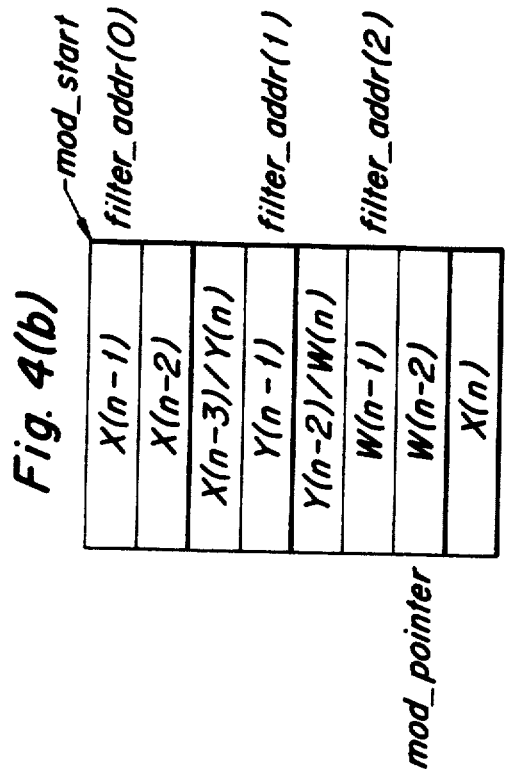
Figure 4D:
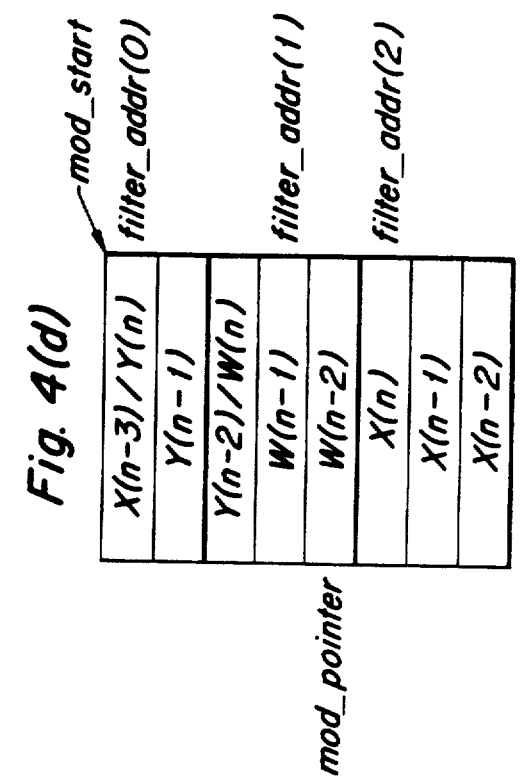
Figure 4A:
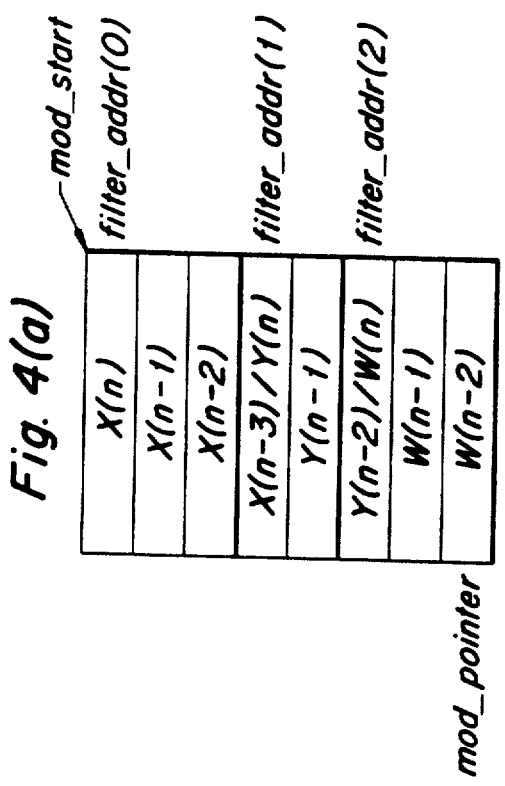
Figure 4C:
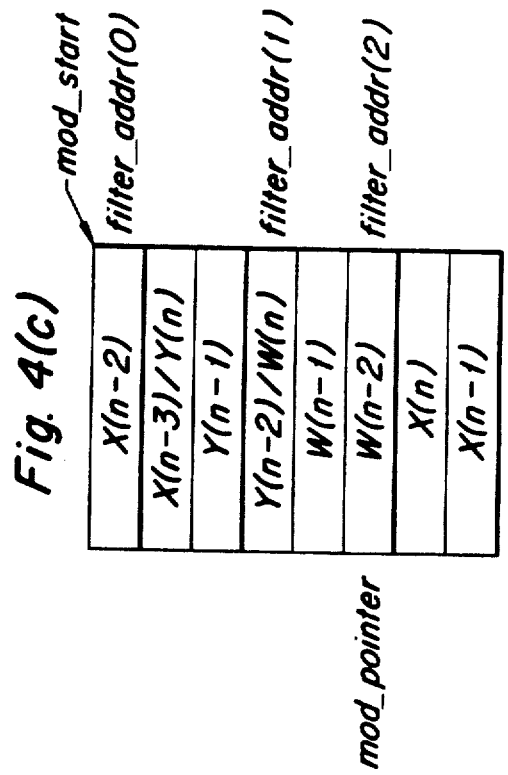

All these calculation are performed at the stage that is shown in FIG. 4(a). In the transition to FIG. 4(b) mod__pointer is decremented by 1 and n is incremented by 1, so that X(n) now is called X(n−1), etc. The next input signal value is written into the position that is denoted X(n), whereafter the calculation cycle above is repeated.

In this way mod__pointer is counted down one unit for each of the FIG. 4(a)−(h). When the filters have been calculated in FIG. 4(h) and mod__pointer is to be updated a folding back to the position shown in FIG. 4(a) is performed, whereafter the whole procedure is repeated.

From the above it is clear that the memory area of the buffer is utilized very efficiently. In particular the buffer can be addressed modulo n, where n is an arbitrary positive integer. This method has proven to be especially advantageous if many short filters are to be implemented.

Figure 6:
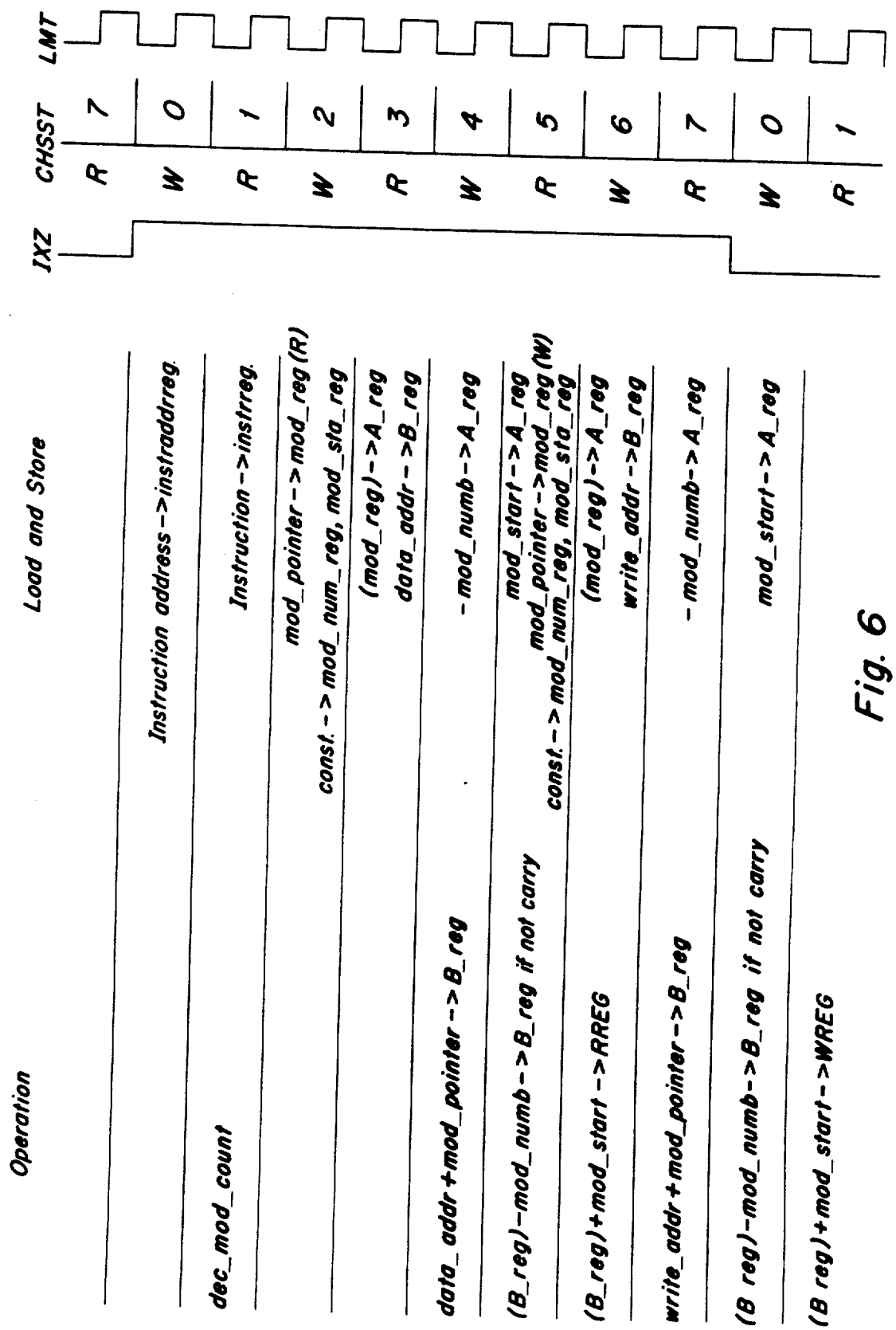
FIG. 6 shows a calculation time diagram for the address processor in accordance with FIG. 5.
Figure 7:
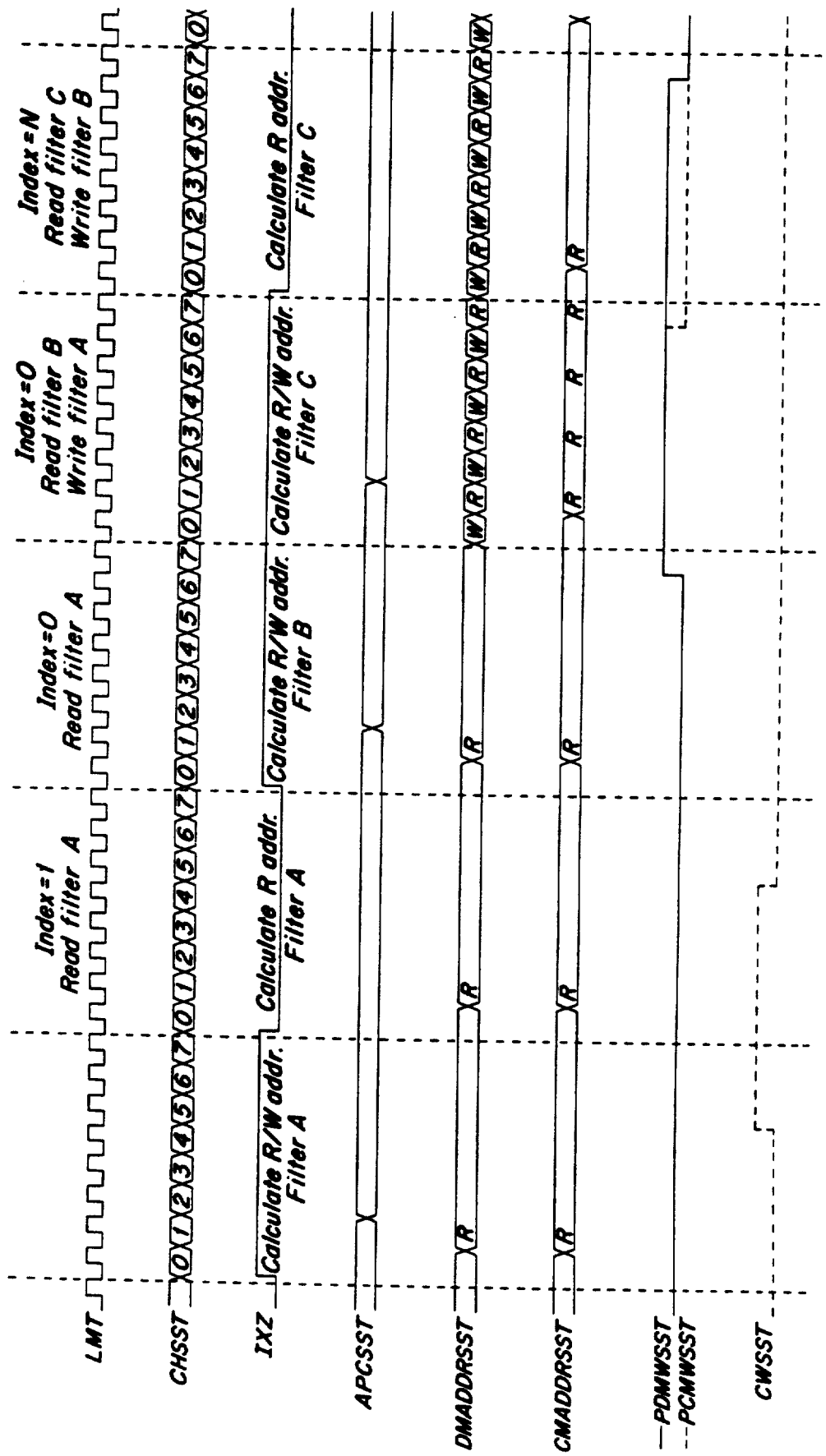
FIG. 7 shows a signal time diagram for the address processor of FIG. 5 for three filters A, B and C with 2, 1 and N taps, respectively, where N is an arbitrary positive integer.

A preferred embodiment of the address processor will be described below with reference to FIGS. 5–7.

Figure 5:
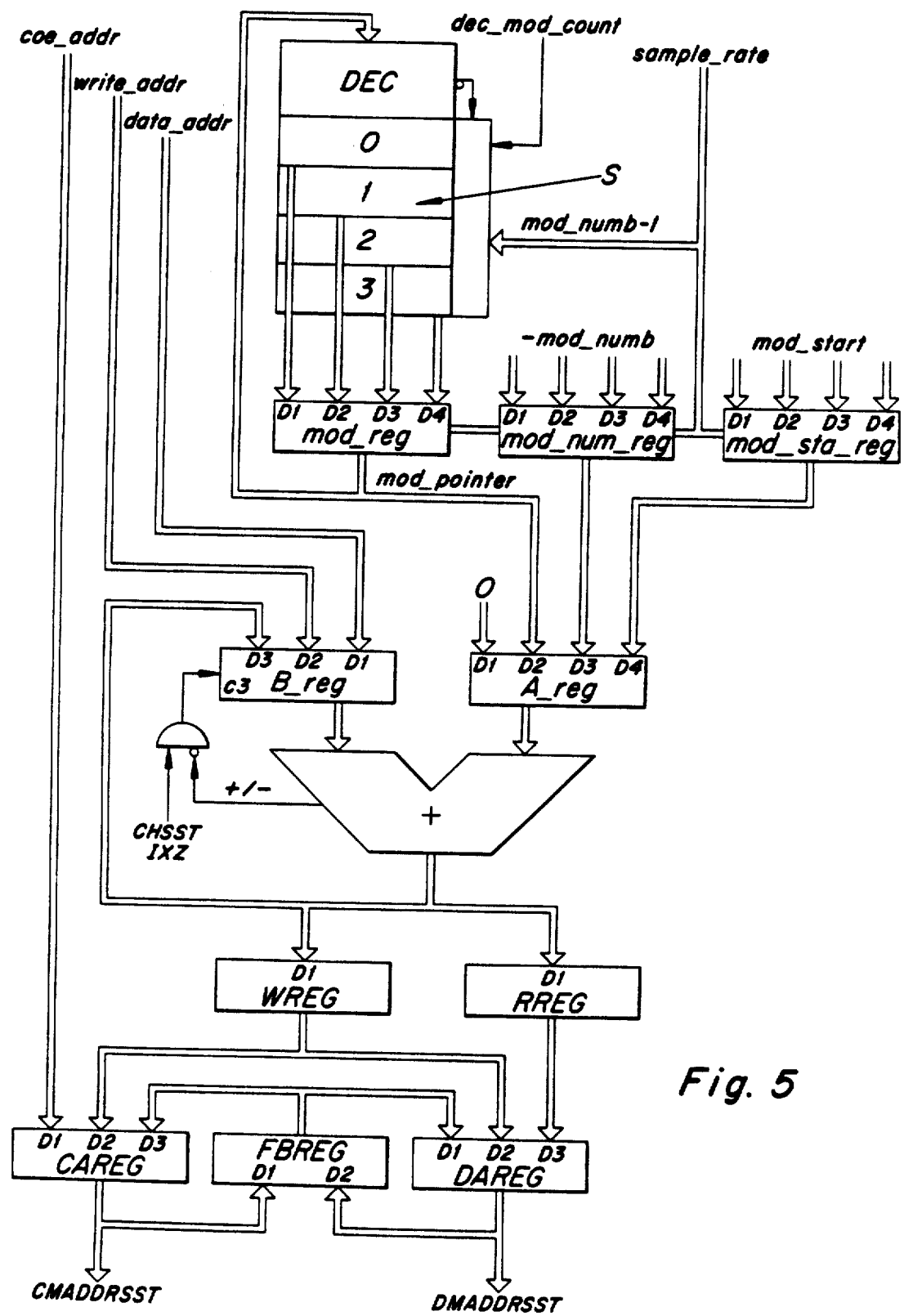
FIG. 5 shows a preferred embodiment of an address processor in accordance with the present invention.

In accordance with FIG. 5 the address processor can logically be divided into three different sections. In the first, top section buffer constants are stored. In the second, middle section the address calculation is performed. Finally, in the third, bottom section the addresses are stored for accessing the memories at suitable points in time.

For each sampling frequency, sample__rate, a pointer, mod__pointer, is stored. In the preferred embodiment the address processor comprises a register set S containing four registers for storing four different values of mod__pointer, one for each sampling frequency and thereby for each buffer. In the preferred embodiment these registers have a length of five bits. A decrementing circuit DEC, for instance comprising a half subtracter, decrements a chosen pointer and stores the same in the corresponding register after use in accordance with the above. When the pointer reaches the value 0, that is when a folding of the buffer is appropriate, a constant is loaded into the register. This constant can be hard wired to the inputs of the register. The value of the constant is mod__numb-1, where mod__numb is the length of the buffer. A decrementation of mod__pointer is performed when the signal dec__mod__count is high. A chosen pointer is loaded into a register mod__reg before it is decremented or loaded into the calculation section. The constants for buffer size and buffer location in the memory can also be hard wired on the register inputs. The signal sample__rate chooses the constants corresponding to a certain sampling frequency for storing in the different registers. Each register in the preferred embodiment comprises four inputs D1-D4, one for each sampling frequency. The constant for buffer size, mod__numb, is loaded as a two-complement value, that is as -mod__numb. The constant is loaded in a register mod__num__reg with a length of five bits. The constant for the buffer location in the memory is loaded as mod__start in a register mod__sta__reg with a word length of 6 bits.

The calculation section comprises two registers A__reg, that has a length of 6 bits, B-reg, that has a length of 5 bits, and also a 6 bit adder, for instance a so called carry boost adder, where the most significant bit of the adder is a half adder cell.

The address calculation starts by loading either data__addr or write__addr in B__reg, depending on whether a read or write operation is to performed. A__reg is loaded with either mod__pointer from mod__reg on input D2 or 0 on input D1. The loading of register A__reg is controlled by a modulo deactivating signal mod__dis depending on the chosen addressing mode, either modulo or absolute addressing.

In absolute addressing mode (mod__dis is high) 0 is loaded into register A__reg, so that the input address, data__addr or write__addr, is added to 0. This makes the calculation unit transparent for absolute addressing.

In modulo mode the mode__pointer loaded into A__reg is added to the address loaded in B__reg, either data__addr or write__addr. The result is fed back to input D3 of register B__reg.

The two-complement value of mod__numb, that is -mod__numb, stored in register mod__num__reg is transferred to register A__reg and added to the contents of register B__reg. The result is stored in B__reg if said result is non-negative. If the result is negative the old value is stored in register B__reg for the next operation. Since the register mod__num__reg has been loaded with the two-complement of mod__numb, that is -mod__numb, this test procedure is facilitated since the sign of the result from the edition directly can be read out from the most significant bit in said result. This bit over line +/− together with the signals CHSST and IXZ in FIG. 7 controls the loading of register B__reg.

The constant mod__start transferred from register mod__sta__reg to register A__reg in the next step is added to the contents of register B__reg, and the result is stored in a register RREG for a read operation or in register WREG for a write operation. This result is the final memory address for reading or writing.

For reading of coefficients, where absolute addressing is used, the coefficient address coe__addr is fed directly to a register CAREG.

The bottom section of the address processor, which is provided for storing of addresses and accessing of the memory, comprises five six bit registers. Registers RREG and WREG have already been mentioned and comprise only one input D1. Registers DAREG and CAREG are connected to the data memory bus DMADDRSST and coefficient memory data bus CMADDRSST, respectively. The fifth register, FBREG, stores read and write addresses in a cyclic way. The addresses are fed back from the output busses CMADDRSST and DMADDRSST, respectively, to the corresponding inputs D1 and D2. This feedback operation is controlled by signals PDMWSST and PCMWSST in FIG. 7.

The feedback addressing scheme is used only when the address processor alternatively gives write and read addresses. This happens when a filter calculation is complete and the result is written into a memory cell simultaneously with the start of a new filter calculation for the next filter and data are read from the memory for this calculation. Writing is performed when CHSST is even and reading is performed when CHSST is odd, see FIG. 6 (in FIGS. 6 and 7 R stands for reading and W for writing).

In the preferred embodiment of the invention eight channels are processed in a cyclic read/write process. Two channels are processed simultaneously so that the last read/write operation will be performed in cycles 6 and 7.

For a more detailed description of the operation of the preferred embodiment of the address processor in accordance with the present invention it is referred to the following signal definitions for the address processor and to the following simulation of the address processor in the simulation language RTL from Texas Instruments.

| Signal definitions for address processor |
|---|
| Input signals to address processor |

Signals and variables that end in "sst" indicate that the values are "Stable" on the "Slave" clock phase and are in the "True" state.

| | |
|---|---|
| BUS 8 chsst; | # Channel Select. |
| SIGNAL iz1sst; | # Index Zero and chsst are gated. IXZ goes |
| SIGNAL iz6sst; | # to high level when the last sample is |
| SIGNAL iz7sst; | # read from the memory. |
| SIGNAL pdmwsst; | # Prepare Data Memory Write. |
| SIGNAL pcmwsst; | # Prepare Coefficient Memory Write. |
| Controls loading of data and coefficient write addresses in output registers DAREG, CAREG and FBREG. | |
| SIGNAL cwsst; | # Coefficient Write mode. |

Sets the address processor in absolute address calculation mode. The calculation of the write address for the coefficient memory starts when this signal goes to high level. "apcsst" forms a part of the instruction word that comes from the controller unit.

| | | | |
|---|---|---|---|
| BUS 23 apcsst; | | | # Address Processor Control. |
| coe_addr | = | apcsst[5:0]; | # 6-bit Coefficient address. |
| data_addr | = | apcsst[10:6]; | # 5-bit Data address. |
| write_addr | = | apcsst[15:11]; | # 5-bit Write address. |

Data and write addresses are decremented by one each time the index counter is decremented. The index counter is loaded with the filter length "number_of_taps". This is all done in the controller unit

| | | | |
|---|---|---|---|
| dec_mod_count | = | apcsst[16]; | # 1-bit Control signal for decrementing the modulo counter. |
| mod_en_r | = | apcsst[17]; | # 1-bit Enables modulo address calculation, read mode. |
| sample_rate_r | = | apcsst[19:18]; | # 2-bit Selects circular buffer read mode. |
| mod_en_w | = | apcsst[20]; | # 1-bit Enables modulo address calculation, write mode. |
| sample_rate_w | = | apcsst[22:21]; | # 2-bit Selects circular buffer, write mode. |

Clock- and Testsignals.

| | |
|---|---|
| SIGNAL lst; | # Local Slaveclock True. |
| SIGNAL lmt; | # Local Masterclock True. |
| SIGNAL ltt; | # Local Testclock True. |
| SIGNAL lgsrlltt; | # Local Testclock for Global Scan Chain. |
| SIGNAL lscanisst; | # Test Scan Local Input. |
| SIGNAL gscanisst; | # Test Scan Global Input. |
| SIGNAL lscanosst; | # Test Scan Local Output. |
| SIGNAL gscanosst; | # Test Scan Global Output. |

Output Signals from Address Processor

| | |
|---|---|
| BUS 6 dmaddrsst; | # Data Memory Address. |
| BUS 6 cmaddrsst; | # Coefficient Memory Address. |

Local Variables

| | |
|---|---|
| REG 6 d_a_reg; | # Data address register DAREG. |
| REG 6 c_a_reg; | # Coefficient address register CAREG. |
| REG 6 w_del_reg_m; | # Write delay register master WREG. |
| REG 6 w_del_reg_s; | # Write delay register slave. |
| REG 6 r_del_reg_m; | # Read delay register master RREG. |
| REG 6 r_del_reg_s; | # Read delay register slave. |
| REG 6 feedback_reg_m; | # Feedback register master FBREG. |
| REG 6 feedback_reg_s; | # Feedback register slave |
| REG 6 a_reg; | # Input register to Adder. |
| REG 6 b_reg; | # Input register to Adder. |
| REG 5 mod_reg_m; | # Modulo pointer register master. |
| REG 5 mod_reg_s; | # Modulo pointer register slave. |
| REG 6 mod_numb_reg_m; | # Modulo number register master. |
| REG 6 mod_numb_reg_s; | # Modulo number register slave. |
| REG 6 mod_start_reg_m; | # Modulo start register master. |
| REG 6 mod_start_reg_s; | # Modulo start register slave. |

Index zero gated with channel select time slot 7.

| | |
|---|---|
| FF iz7_del1_m; | # Index zero delayed flip flop master. |
| FF iz7_del1; | # Index zero delayed flip flop slave. |
| FF iz7_del2 m; | # Index zero delayed flip flop master. |
| FF iz7_del2; | # Index zero delayed flip flop slave. |
| REG 5 mod_a_reg_m(4); | # Modulo pointer register stack master ( mod_numb-1 ). |
| REG 5 mod_a_reg_s(4); | # Modulo pointer register stack slave. |
| REG 6 sum; | # Output bus from adder. |
| SIGNAL mod_dis; | # Modulo disable, absolute addressing when true. |
| BUS 2 sample_rate; | # Sample rate. Selects circular buffer depending on sampling buffer depending on sampling frequency. |
| ROM 5 mod_numb(4); | # 4, 5-bits Modulo number constants ( -mod_numb ). |
| ROM 6 mod_start(4); | # 4, 6-bits Modulo start constants. |

SIMULATION OF THE ADDRESS PROCESSOR IN RTL

```
BLOCK addrpr (
    INPUT BUS 8 chsst;      # Channel Select
    INPUT SIGNAL iz1sst;    # Index Zero
    INPUT SIGNAL iz6sst;
```

```
    INPUT SIGNAL iz7sst;
    INPUT SIGNAL pdmwsst;      # Prepare Data Memory write
    INPUT SIGNAL pcmwsst;      # Prepare Coefficient Memory write
    INPUT SIGNAL cwsst;        # Coefficient write
    INPUT BUS 23 apcsst;       # Address processor Control
        coe_addr       = apcsst[5:0];    #6-bit Coefficient
        data_addr      = apcsst[10:6];   #5-bit Data address
        write_addr     = apcsst[15:11];  #5-bit Write address
        dec_mod_count  = apcsst[16];     #1-bit Contr. sign.
        mod_en_r       = apcsst[17];     #1-bit Enable read
        sample_rate_r  = apcsst[19:18];  #2-bit Select read
        mod_en_w       = apcsst[20];     #1-bit Enable write
        sample_rate_w  = apcsst[22:21];  #2-bit Select write
    INPUT SIGNAL lst;          # Slave Clock
    INPUT SIGNAL lmt;          # Master Clock
    INPUT SIGNAL ltt;          # Test Clock Local
    INPUT SIGNAL lgsrlltt;     # Test Clock Global
    INPUT SIGNAL lscanisst;    # Test scan Local Input
    INPUT SIGNAL gscanisst;    # Test scan Global Input
    OUTPUT SIGNAL lscanosst;   # Test scan Local Output
    OUTPUT SIGNAL gscanosst;   # Test scan Global Output
    OUTPUT BUS 6 dmaddrsst;    # Data memory address
    OUTPUT BUS 6 cmaddrsst;)   # Coefficient memory address LOCAL REG 6 d_a_reg;           # Data address register
LOCAL REG 6 c_a_reg;           # Coefficient address register
LOCAL REG 6 w_del_reg_m;       # Write delay register master
LOCAL REG 6 w_del_reg_s;       # Write delay register slave
LOCAL REG 6 r_del_reg_m;       # Read delay register master
LOCAL REG 6 r_del_reg_s;       # Read delay register slave
LOCAL REG 6 feedback_reg_m;    # Feedback register master
LOCAL REG 6 feedback_reg_s;    # Feedback register slave
LOCAL REG 6 a_reg;             # Input register adder
LOCAL REG 6 b_reg;             # Input register adder
LOCAL REG 5 mod_reg_m;         # Modulo register master
LOCAL REG 5 mod_reg_s;         # Modulo register slave
LOCAL REG 6 mod_numb_reg_m;    # Modulo number register master
LOCAL REG 6 mod_numb_reg_s;    # Modulo number register slave
```

```
    LOCAL REG 6 mod_start_reg_m;    # Modulo start register master
    LOCAL REG 6 mod_start_reg_s;    # Modulo start register slave
    LOCAL FF iz7_del1_m;            # Index zero delayed Flip Flop
                                    # master LOCAL FF iz7_del1;              # Index zero delayed Flip Flop
                                    # slave LOCAL FF iz7_del2_m;            # Index zero delayed Flip Flop
                                    # master LOCAL FF iz7_del2;              # Index zero delayed Flip Flop
                                    # slave LOCAL REG 5 mod_a_reg_m(4);     # Modulo register stack master
    LOCAL REG 5 mod_a_reg_s(4);     # Modulo register stack slave
    LOCAL REG 6 sum;                # Output register adder
    LOCAL SIGNAL mod_dis;           # Modulo disable
    LOCAL BUS 2 sample_rate;        # Sample rate
    ROM 5 mod_numb(4);              # Modulo number constants
    ROM 6 mod_start(4);             # Modulo start constants

===============================================================

BEHAVIOUR

# Circular buffer constants,    Sampling Frequency
    # ---------------------------   ------------------
    mod_numb(0):=15;                # 32 kHz, Buffer size
    mod_numb(1):=16;                # 16 kHz
    mod_numb(2):=9;                 # 8   kHz
    mod_numb(3):=5;                 # 500 Hz mod_start(0):=49;               # 32 kHz, Start address in memory
    mod_start(1):=33;               # 16 kHz
    mod_start(2):=24;               # 8   kHz
    mod_start(3):=20;               # 500 Hz

# ===============================================================
    # If true, absolute addressing mode
```

```
# ----------------------------------------
mod_dis:=(~mod_en_w+cwsst)*(iz6sst+iz7sst+iz7_del1)+
         ~mod_en_r*(chsst[3]+chsst[4]+chsst[5]);

# ==========================================================
** modulo counter ** sample_rate:=SELECT( chsst[5] : sample_rate_w;   # Selects
                     ELSE sample_rate_r );       # circular
                                                 # buffer

# Detect lmt edge, "decrement modulo counter" in "Index
# zero 1" time slot
# ----------------------------------------------------------
IF lmt*~\lmt*dec_mod_count*iz1sst
    IF mod_reg_s = 0              # Initialize buffer pointer
        mod_a_reg_m(sample_rate):=mod_numb(sample_rate) - 1;
    ELSE                          # Decrements buffer pointer
        mod_a_reg_m(sample_rate) := mod_reg_s - 1;
    END
END , IF lst                                  # Master to Slave
    mod_a_reg_s(sample_rate):=mod_a_reg_m(sample_rate);
END
# ==========================================================
IF lmt        # Master Clock Phase iz7_del1_m:=iz7sst;    # "Delay Index zero 7" 1 and 2
    iz7_del2_m:=iz7_del1;  # cycles respectively
    # Load modulo register from stack
    mod_reg_m:=mod_a_reg_s(sample_rate);
    IF ( chsst[2] + chsst[5] )
        # Load buffer size
        mod_numb_reg_m:=(-mod_numb(sample_rate));
        # Load buffer start address
        mod_start_reg_m:=mod_start(sample_rate);
    END
```

```
# Load A and B registers with data
#------------------------------------------------------
a_reg := SELECT
        (
            (chsst[5]+chsst[0])*~mod_dis : mod_start_reg_s;
            (chsst[4]+chsst[7])*~mod_dis : mod_numb_reg_s;
            (chsst[3]+chsst[6])*~mod_dis : mod_reg_s;
            mod_dis : 0X00;     # absolute addressing mode
            ELSE \a_reg         # Keep old data in reg. A
        );

b_reg := SELECT
    (
        chsst[3] : data_addr;
        iz6sst   : write_addr;
        ~sum[5]*(chsst[4]+chsst[5]+iz7sst+iz7_del1) : sum;
        ELSE \b_reg      # Keep old data in reg. B
    );
IF chsst[6]
    r_del_reg_m := sum;   # Load "read delay register"
END                       # with calculated address RREG
IF iz7_del2
    w_del_reg_m := sum;   # Load "write delay register"
END                       # with calculated address WREG

#------------------------------------------------------
# **** Load coefficient address CAREG ****
c_a_reg := SELECT
        (
            iz7sst*pcmwsst : w_del_reg_s;   # WREG
            chsst[0] : coe_addr;  # External address
            ~iz7sst*~chsst[0]*pcmwsst : feedback_reg_s ;
            ELSE \ c_a_reg
        );

#------------------------------------------------------
# **** Load data address DAREG ****
d_a_reg :=SELECT
```

```
            (
                iz7sst*pdmwsst : w_del_reg_s;    # WREG
                chsst[0] : r_del_reg_s;          # RREG
                ~iz7sst*~chsst[0]*pdmwsst : feedback_reg_s;
                ELSE \ d_a_reg
            );

#-------------------------------------------------------------
# **** Load Feedbacked address FBREG ****
feedback_reg_m :=SELECT
            (
                pdmwsst : dmaddrsst;  # Data mem. addr.
                pcmwsst : cmaddrsst;  # Coeff. mem. addr.
                ELSE \ feedback_reg_m
            );

END # lmt
# ==============================================================
# Master to Slave Transfer
#------------------------------
IF lst
    mod_reg_s := mod_reg_m;
    mod_numb_reg_s := mod_numb_reg_m;
    mod_start_reg_s := mod_start_reg_m;
    sum := a_reg + b_reg;  # Calculate
    r_del_reg_s := r_del_reg_m;
    w_del_reg_s := w_del_reg_m;
    feedback_reg_s := feedback_reg_m;
    dmaddrsst := d_a_reg;   # Put data address on bus
    cmaddrsst := c_a_reg;   # Put coefficient address on bus
    iz7_del1 := iz7_del1_m;
    iz7_del2 := iz7_del2_m;
    END # lst
END # behaviour
```

It is appreciated that the invention is not limited to the specifically described embodiments and that many modifications can be performed by a man skilled in the art. For instance, the buffer length can be reduced by one so that it becomes the sum of the number of delay elements in the filters that are contained in the buffer, if the latest sample X(n) is stored in an extra register instead. Furthermore, the number of channels, the number of buffers in each channels, the word length for the different registers and the method of loading constants in the different registers can be varied without departure from the inventive idea that is defined in the following patents claims.

It is appreciated that the invention is not limited to the specifically described embodiments and that many modifications can be performed by a man skilled in the art. For instance, the buffer length can be reduced by one so that it becomes the sum of the number of delay elements in the filters that are contained in the buffer, if the latest sample X(n) is stored in an extra register instead. Furthermore, the number of channels, the number of buffers in each channels, the word length for the different registers and the method of loading constants in the different registers can be varied without departure from the inventive idea that is defined in the following patents claims.

We claim:

1. An address processor for a signal processor, comprising means for address calculation in a read/write memory containing one or more circular buffers for storing state variables of digital filters, at least one of said buffers containing state variables of at least two digital filters, each of the filters in the same buffer corresponding to the same sampling frequency and the length of each buffer depending on the sum of a number of delay elements in the filters of the buffer, said means comprising:

(a) register means for storing a current folding address of each circular buffer relative to a corresponding buffer start address in said read/write memory and (b) calculation means for adding, for a selected state variable of a selected filter in a selected buffer, the current folding address of said selected buffer to a displacement of said selected state variable relative to a start address within said selected buffer of said selected filter, to obtain a first value, reducing the first value by the length of said selected buffer if said sum exceeds or is equal to said buffer length to obtain a second value, and adding the buffer start address of said selected buffer to said second value to obtain the absolute address of said selected state variable in said read/write memory.

2. The address processor according to claim 1, wherein the length of each buffer is formed by the sum of the number of delay elements in the filters in the buffer plus one.

3. The address processor according to claim 1, wherein said calculation means is formed by an adder, and the possible reduction being performed by adding the two-complement of the length of said selected buffer to the first value.

4. The address processor according to claim 3, including a first register in said register means for storing the current folding address, the two-complement of the length of said selected buffer and the start address of said selected buffer in sequential storage locations.

5. The address processor according to claim 4, including a second register in said register means for storing the displacement of said selected state variable relative to the start address within said selected buffer of said selected filter, the first value and the second value in sequential storage locations.

6. The address processor according to claim 5, wherein the most significant bit in said adder after the calculation of the second value is used as a sign bit and the first value is kept in said second register if the second value is negative, and wherein the first value in said second register is replaced by the second value if the second value is not negative.

7. The address processor according to claim 1, wherein each filter is calculated by fetching the state variables of the filter and the corresponding coefficients in sequence after each other by using an index, that is equal to the number of delay elements in the respective filter, said index being added to the filter start position to generate the displacement used for obtaining the oldest state variable and the corresponding coefficient and then being successively decremented down to 0 for obtaining younger and younger state variables.

8. The address processor according to claim 7, wherein the value of a calculated filter is written into the memory position of the oldest state variable in a previous filter, so that this memory position is reused.

9. The address processor according to claim 1, wherein said register means contains four registers.

* * * * *